May 20, 1969 J. J. AMODEI 3,445,777
THERMAL FEEDBACK FOR STABILIZATION OF
DIFFERENTIAL AMPLIFIER UNBALANCE
Filed Sept. 24, 1965
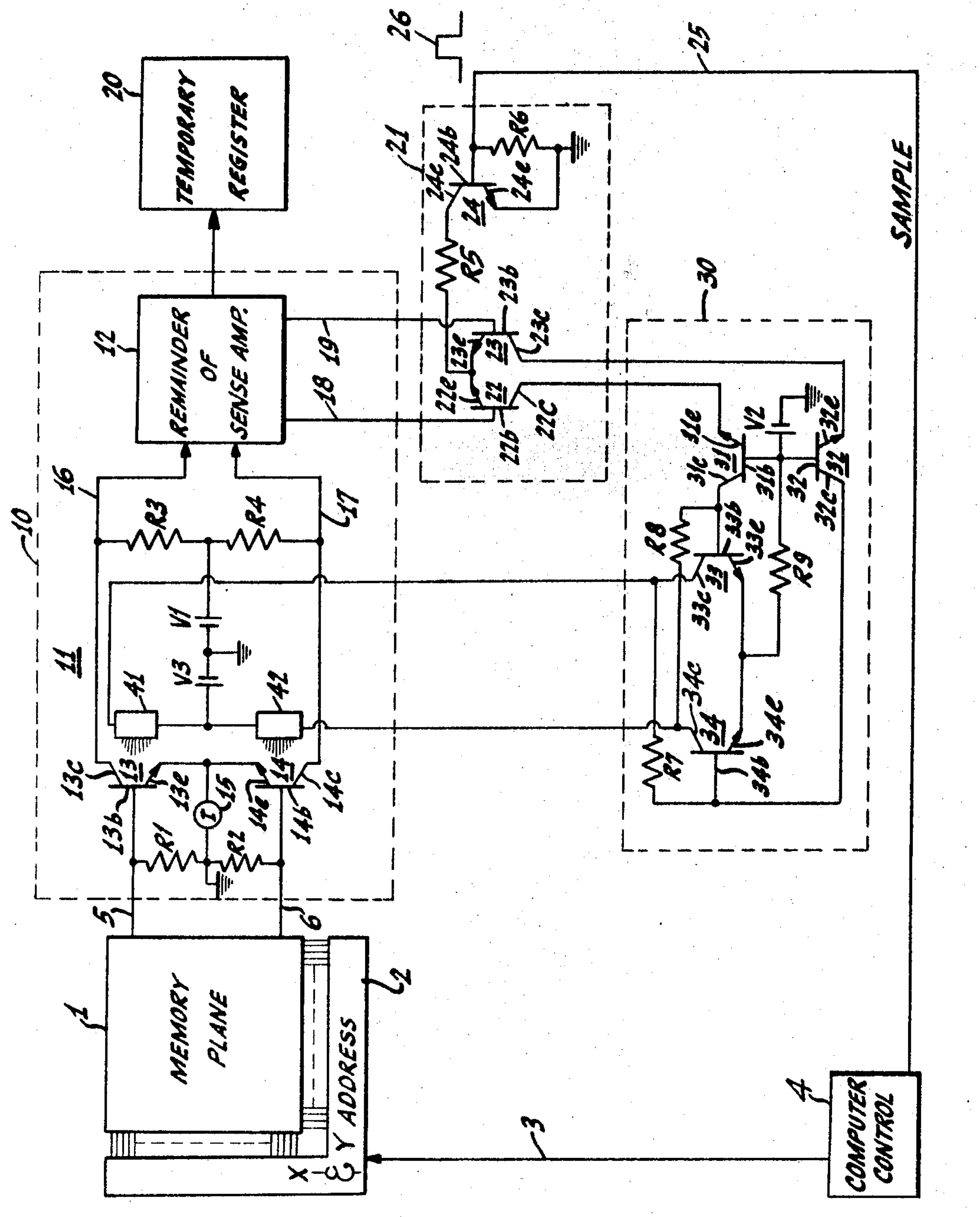
INVENTOR.
JUAN J. AMODEI
BY John V. Regan
Attorney United States Patent Office 3,445,777
Patented May 20, 1969

3,445,777
THERMAL FEEDBACK FOR STABILIZATION OF DIFFERENTIAL AMPLIFIER UNBALANCE

Juan J. Amodei, Levittown, Pa., assignor to Radio Corporation of America, a corporation of Delaware Filed Sept. 24, 1965, Ser. No. 489,942
Int. Cl. H03f 1/32, 3/04
U.S. Cl. 330—23 17 Claims

ABSTRACT OF THE DISCLOSURE

D.C. unbalance in a differential amplifier is corrected by a thermal feedback scheme from the differential outputs of the last stage to either one or the other of two heat producing elements which are associated with the transistors of the input stage. The D.C. unbalance is detected on a sample basis at the last stage output and depending on its polarity places a flip-flop in one or the other of its two states. The flip-flop outputs are connected so that one or the other of the heat producing elements is energized. The heat of the energized element increases the collector current of its associated transistor, thereby tending to correct for D.C. unbalance.

This invention relates to electric circuitry and, in particular, to an arrangement including a novel switching circuit for correcting D.C. unbalance in the differential stages of amplifiers.

A transistorized differential amplifying stage generally inculdes a pair of transistors each having a collector resistor and forming two parallel paths for current supplied by a current source to the emitter electrodes of the transistor pair. So long as the component pairs of transistors, collector resistors and the base electrode bias circuits are identical, equal currents flow in the two parallel paths resulting in equal or balanced D.C. voltages at the collector electrodes of the transistor pair. Whenever a mismatch of any of these component pairs occurs, unequal currents flow in the two parallel paths and unequal or unbalanced D.C. voltages appear at the collector electrodes of the transistor pair.

The component mismatch may be a result of circuit fabrication as by limited choice of discrete components or as by imperfections in the process of forming integrated circuit structures. The mismatch can also be caused during use of the circuit by different temperature conditions existing at the pair of components to be matched.

One prior art arrangement for correcting D.C. unbalance maintains both differential transistors at the same temperature. This type of arrangement does not correct for mismatched transistors caused by circuit fabrication. Moreover, this type of arrangement does not correct for mismatched collector resistors or base electrode bias circuits. Another prior art corrective arrangement for D.C. unbalance continuously feeds the output back to the input. However, this arrangement is adequate only when the average input signal can be approximated as zero during a period which is small relative to the time constant to the feedback path. Low pass filter networks with relatively large capacitances are sometimes inserted in the feedback path to lengthen the time constant. Since it is difficult by present day technology to fabricate large capacitors in integrated circuit structures, the low pass filter corrective arrangement is undesirable.

An object of this invention is to provide a novel switching circuit arrangement.

Another object of this invention is to provide a novel arrangement for correcting D.C. unbalance in differential amplifying stages due to any cause.

A further object of this invention is to provide a novel corrective arrangement for D.C. unbalance in differential amplifying stages without the use of low pass capacitance networks.

In brief, the present invention takes advantage of the concept that the voltage drop across a P-N junction of a semiconductive device, such as the base to emitter junction of a transistor, varies inversely with temperature changes. For a transistor, the collector current varies directly with the temperature changes. In combination with the direct coupled differential stages of an amplifier there is provided a detector circuit for sensing any D.C. unbalance between the differential outputs of one of the stages during intervals when no information signal is present and providing a push-pull output in response thereto. Separate heater elements are disposed in close proximity to each transistor of the input differential pair so that the heater elements and associated transistors are operable as thermal transfer units. A flip-flop circuit responds to the push-pull output of the detector circuit to activate the heater element associated with the input transistor having the larger D.C. collector voltage. The push-pull signal pulls the on transistor of the flip-flop off and pushes the off transistor on, thereby causing it to switch to the desired state. The heat dissipated by the heater element is transferred to the input transistor. The transistor collector current increases and the D.C. collector voltage decreases, thereby tending to correct for the D.C. unbalance.

The sole figure of the drawing is a circuit diagram of a corrective arrangement according to the persent invention for D.C. unbalance.

The present invention is contemplated for use in correcting D.C. unbalance between differential circuit output points in direct coupled differential stages of any amplifier in which it is desirable to correct for D.C. unbalance. Although not restricted thereto, the invention is illustrated in the environment of a sense amplifier for amplifying low level signals sensed from a computer memory. This environment is illustrated in the drawing as including a memory plane 1, an X and Y address unit 2, and a computer control unit 4 coupled to the address unit by a conductor means 3. The memory plane 1 is comprised of a rectangular array of bistable memory cells (not shown), which cells may be magnetic in nature. Each memory cell is capable of storing one bit of binary information, either in binary "1" or "0" depending upon the state of the cell.

The address unit 2 in accordance with a READ-WRITE duty cycle controlled by the control unit 4 reads and writes "1"s or "0"s into the memory cells of the plane 1. Upon readout of a memory cell, a low level "1" or "0" signal is generated on the sense line of the memory plane. The sense line is illustrated as being double-ended at terminals 5 and 6.

The low level signals are coupled by way of a sense amplifier designated generally at 10 to a temporary storage register 20. The temporary storage register is conventional in nature and may include a flip-flop circuit having a well-defined threshold level. The sense amplifier 10 includes at least a first differential stage 11 which is coupled to the other differential stages not shown but included in the block 12 labeled Remainder of Sense Amplifier. The direct coupling may include a current amplification stage such as a transistor (not shown) connected in the emitter follower configuration. Alternatively, the input stage 11 may be the only differential stage. Whatever the design, the conductors 18 and 19 at the block 12 are the differential outputs taken from one of the differential stages, preferably the last one.

The differential input stage 11 includes a pair of similar transistors 13 and 14. The transistor base electrodes 13*b* and 14*b* are coupled to the sense line terminals 5 and 6, respectively. The transistor base electrodes 13*b* and 14*b* are also connected by way of identical base resistors R1 and R2, respectively, to ground, illustrated by the conventional ground symbol. Similar collector resistors R3 and R4 couple the collector electrodes 13*c* and 14*c*, respectively, to the positive terminal of a source of operating voltage V1, illustrated as a battery having its negative terminal grounded. The emitter electrodes 13*e* and 14*e* are connected in common to a current determining element 15 illustrated as a current source having its other terminal grounded. The current source 15 is conventional in nature and may include a transistor. Differential outputs 16 and 17 couple the collectors 13*c* and 14*c* to the next stage of the amplifier inside the block 12.

Under the ideal D.C. operating conditions of identical transistors, identical collector resistors, identical base resistors, and uniform temperature conditions the operating voltage V1 and the current element 15 are so related that the transistors are identically biased into conduction. The current of the current determining element 15 divides equally at the common connection of the emitters 13*e* and 14*e*. The collector currents are identical and the D.C. collector voltages at the collectors 13*c* and 14*c* are identical and balanced.

In practice the above specified ideal conditions seldom exist. As mentioned previously, the transistors, collector resistors or base resistors may not be identical as a result of circuit fabrication. Even in integrated circuit structures, the collector or the base resistors are seldom identical. Moreover, the temperature conditions existing at each of the circuit components are not always the same. The net result is that the D.C. operating conditions become unbalanced. For example, the collector resistor R4 may be smaller than the other collector resistor R3. In such case, the D.C. collector voltage at the collector 14*c* is more positive than the D.C. collector voltage at the collector 13*c* This D.C. unbalance is comparable to the departure from the ideal D.C. operating condition caused by a low-level signal which is more positive at the base 13*b* than at the base 14*b*. Thus, it is difficult to distinguish between D.C. unbalance and the information signal.

The present invention provides a scheme for correcting this D.C. unbalance whether it be due to component mismatch or due to temperature difference at the locations of the components. Generally, the corrective scheme includes a control means responsive to unbalance in D.C. operating voltage and a pair of heat producing elements 41 and 42 associated with transistors 13 and 14, respectively. The heat producing elements 41 and 42 are disposed in close proximity to or are located close enough to their associated transistors so that there can be a substantial transfer of heat from the heater elements to the temperature sensitive junctions of the transistors. Essentially, each heater element and its associated temperature sensitive transistor can be regarded as the heater and sensor of a thermal transfer unit. The heat producing elements are conventional in nature in that they respond to electrical energy to dissipate heat. As such the heat producing elements may be passive (resistor or diode) or active (transistor) circuits.

The control means includes a detector circuit 21 and a flip-flop 30.

The detector circuit 21 includes a differential pair of detecting transistors 22 and 23 having their base electrodes 22*b* and 23*b* connected to the differential output points 18 and 19, respectively. The detecting transistor emitter electrodes 22*e* and 23*e* are connected in common and by way of a resistor R5 to the collector electrode 24*c* of a sampled current determining transistor 24. The base electrode 24*b* is connected by way of resistor R6 to ground; while the emitter electrode 24*e* is directly connected to ground. The base electrode 24*b* is further connected by way of a conductor 25 to the computer control unit 4 in order to receive a sampling pulse 26. The detecting transistor collector electrodes 22*c* and 23*c* are connected to the flip-flop 30.

The current determining transistor 24 responds to a positive sampling pulse 26 to enable the detecting transistors 22 and 23 to detect differences in D.C. voltages between the differential output points 18 and 19. The control unit 4 is operative to generate the sampling pulse 26 during an interval within the READ-WRITE duty cycle when information is neither being written into nor read from the memory plane 1. In the absence of the sampling pulse, the current determining transistor 24 and the differential pair of detecting transistors 22 and 23 are cut off. When the sampling signal is applied to the base electrode 24*b*, the current determining transistor 24 becomes biased into conduction with its collector current being applied by way of resistance R5 to the emitter eltctrodes 22*e* and 23*e* of the detecting transistors. The latter transistors become biased into conduction. If the D.C. voltages at the differential output points are unbalanced so that the output 18 is more positive, the collector current of transistor 22 tends to increase while the collector current of transistor 23 tends to decrease. On the other hand, if the output point 19 is more positive, the collector current of transistor 22 tends to decrease while the collector current of transistor 23 tends to increase. At the termination of the sampling pulse 26 the transistors 22, 23 and 24 again become cut off. Consequently, the detector circuit 21 responds to D.C. voltage unbalance at the differential output points 18 and 19 to provide unbalanced or push-pull collector currents at the collectors 22*c* and 23*c* of the differential pair of detecting transistors during the sampling interval.

The flip-flop circuit includes a pair of transistors 33 and 34 cross coupled in the conventional way to form a bistable circuit. To this end the base electrodes 33*b* and 34*b* are coupled to the collector electrodes 34*c* and 33*c*, respectively. The collector electrodes 33*c* and 34*c* are further connected by way of the heat producing elements 41 and 42, respectively, to the positive terminal of a source of operating voltage V3, illustrated as a battery having its negative terminal grounded. The emitter electrodes 33*e* and 34*e* are connected in common and by way of a resistance R9 to the positive terminal of another source of operating potential V2 illustrated as a battery having its negative terminal grounded.

The cross coupled pair of transistors 33 and 34 operate in the current mode as a bistable circuit. The operating voltage V2 and the resistor R9 function as a source of current for the cross coupled transistor pair. In a first stable state transistor 33 is cut off and transistor 34 is conducting. The current path includes the operating voltage V3, the heater element 42, the collector-to-emitter path of transistor 34, resistor R9, the operating voltage V2 and circuit ground. The current flowing in the heat producing element 42 results in a relatively low voltage level at the collector electrode 34*c* which is coupled by resistor R8 to the base electrode 33*b*. This relatively low voltage level tends to hold the transistor 33 in the cut off condition. The current flow in heater element 42 also results in a relatively substantial transfer of heat from the heater element to the temperature sensitive transistor 14. On the other hand, substantially no current flows in the heat producing element 41 so that there is a relatively insubstantial transfer of heat from element 41 to temperature sensitive transistor 13. The collector electrode 33*c* is at a relatively high voltage level which is coupled by resistor R7 to the base electrode 34*b*. This relatively high voltage level tends to hold the transistor 34 in conduction.

For the other stable state of the cross coupled transistor pair, transistor 33 conducts and transistor 34 is cut off. The current path includes the operating voltage V3, the heat producing element 41, the collector-to-emitter path of transistor 33, resistor R9, the operating voltage V2 and circuit ground. The collector electrode 33_c_ and the base electrode 34_b_ are at relatively low voltage levels; while the collector electrode 34_c_ and base electrode 33_b_ are at relatively high voltage levels. For this stable state, the thermal transfer conditions described for the first stable state are reversed so that there is a substantial thermal transfer between element 41 and transistor 13 and a relatively insubstantial thermal transfer between element 42 and transistor 14.

The flip-flop circuit 30 further includes a pair of transistors 31 and 32. The base electrodes 31_b_ and 32_b_ of these transistors are connected in common to the positive terminal of the voltage supply V2. The collector electrodes 31_c_ and 32_c_ are connected to the base electrodes 33_b_ and 34_b_, respectively, of the cross coupled pair of transistors. The emitter electrodes 31_e_ and 32_e_ are directly connected to the collectors 22_c_ and 23_c_, respectively, of the differential pair of detecting transistors.

The operation of the transistors 31 and 32 is best understood from a consideration of the operation of the entire system. Consider first that the state of the cross coupled transistor pair is such that current is flowing in the heat producing element 42 which is dissipating heat in the vicinity of the input transistor 14. During an interval when information is neither being written into nor read from the memory plane 1, the D.C. voltage at the collector 13_c_ is more positive than the D.C. voltage at the collector 14_c_. For an odd number of differential stages, the differential output point 19 is more positive than the output point 18. When the current determining transistor 24 conducts in response to the sampling pulse 26, the transistor 23 tends to conduct more collector current than transistor 22. The transistor 32 becomes forward biased and operatively clamps the collector 23_c_ to a voltage slightly lower than the operating voltage V2 in order to prevent saturation of transistor 23. Current, in the conventional sense, is discharged or pulled from the base electrode 34_b_ of transistor 34 in order to provide for the increasing collector current of the detecting transistor 24. At the same time, transistor 31 tends to become biased. However, this transistor does not become as conductive as transistor 32 because the collector current of transistor 22 is smaller than the collector current of transistor 23. Thus, during the switching or transition period of the flip-flop, a differential voltage is developed between the two bases of the flip-flop transistors in the direction required to force its state to that required to correct the unbalance.

As the transistor 34 tends to become less conductive during switching, the voltage level at its base electrode tends to become lower. The voltage level at the emitter electrode 34_e_ also tends to decrease because of the resistor R9. At the same time, the voltage level at base electrode 33_b_ is increasing. The net effect is that the transistor 33 tends to turn on before the transistor 34 completely turns off, thereby providing rapid regenerative switching. If the voltage V2 were directly connected to the emitter electrodes 33_e_ and 34_e_, both transistors would tend to turn off during the switching interval. The flip-flop would then favor conduction of the transistor associated with the least conducting one of the transistors 31 and 32. For the preceding example of transistor 31 being the least conductive, the flip-flop favors the conduction of transistor 33. Although the cross coupled transistor pair switches faster with than without the resistor R9, it may be desirable to either not use the resistor or use a transistorized current source for integrated circuit structures in order to reduce heat dissipation.

For the case where the resistor R9 is not utilized, the transistors 31 and 32 operate to aid the cross coupled transistor pair to relax into a new stable state after the sampling interval. As the previously on transistor of the cross coupled pair turns off during the sampling interval, the one of the transistors 31 or 32 associated therewith tends to saturate. When the sampling interval terminates, the stored charge of the saturated transistor tends to hold the previously on transistor of the cross coupled pair off while the previously off transistor turns on. Thus, one of the transistors 31 and 32 tends to saturate during switching, thereby storing charge which aids in the relaxation of the cross coupled transistor pair to the new stable state.

By the time the sampling pulse 26 terminates, the flip-flop circuit 30 is switched from its original state wherein heat producing element 42 is actuated to the other stable state wherein heat producing element 41 is actuated. The current flow in heat producing element 41 dissipates heat which is transferred to the temperature sensitive base emitter junction of the input transistor 13. The collector current of transistor 13 increases as the temperature increases, thereby tending to decrease the D.C. voltage at the collector 13_c_. Consequently, the corrective scheme responds to unbalances of the D.C. operating voltages between differential output circuit points to provide a thermal coupling with one of the input transistors to corect for the D.C. unbalance.

In the preceding description it is assumed that the sense amplifier 10 includes an odd number of differential amplifier stages. It is apparent that the invention also contemplates an even number of differential amplifier stages so long as the locations of the heat producing elements 41 and 42 are exchanged with one another. As mentioned previously, the present invention is not restricted to the computer sense amplifier environment. Moreover, the corrective arrangement may be used in any application even though the average input signal is not zero during a period which is small relative to the time constant of the feedback path.

Although the invention has been illustrated with transistors of the NPN conductivity type, it is apparent that transistors of the PNP conductivity type can also be used so long as the polarities of the various operating voltages are reversed.

What is claimed is:

1. An electrical circuit comprising,
   a first pair of transistors of one conductivity type cross-coupled from the base electrode of each transistor to the collector electrode of the other transistor by means of separate impedances,
   bias means adapted to operate said first pair of transistors as a flip-flop having first and second stable tates,
   a current determining element,
   a second pair of transistors of said one conductivity having their emitter electrodes coupled in common,
   means adapted to apply a difference signal to the base electrodes of said second pair of transistors,
   means for coupling said current determining element to the emitter electrodes of said second transistor pair, and
   separate means for coupling the collector electrodes of said second pair of transistors to the base electrodes of said first pair of transistors, said second pair of transistors responding to said difference signal to provide push-pull switching signals to said first pair of transistors.
2. The invention as claimed in claim 1 wherein
   said means for coupling includes a sampling means for providing a coupling of said current determining element to the emitter electrodes of said second transistor pair only during sampling intervals.
3. The invention as claimed in claim 2 wherein
   said current determining element is a transistor havits collector electrode coupled to the emitter electrodes of said second pair of transistors, and said sampling means applies sampling pulses to the base electrode of said current element transistor, said current element transistor being conductive only when said sampling pulses are applied.

4. The invention as claimed in claim 1 wherein said separate means includes a third pair of transistors, the emitter electrodes of said third transistor pair being separately coupled to individual ones of the collector electrodes of said second transistor pair, and the collector electrodes of said third transistor pair being separately coupled to individual ones of the base electrodes of said first transistor pair, and wherein said bias means is further adapted to apply operating voltage to the base electrodes of said third transistor pair.

5. The invention as claimed in claim 3 wherein said electrical energy is comprised of a differential input signal.

6. The invention as claimed in claim 3 wherein separate means includes a third pair of transistors, the emitter electrodes of said third transistor pair being separately coupled to individual ones of the collector electrodes of said second transistor pair, and the collector electrodes of said third transistor pair being separately coupled to individual ones of the base electrodes of said first transistor pair, and wherein said bias means is further adapted to apply operating voltage to the base electrodes of said third transistor pair.

7. The combination comprising first and second thermal transfer units, each having a temperature sensitive semiconductor device and a heater element in thermally coupled relationship thereto such that heat dissipated by the element increases the conductivity of the associated semiconductor device, first circuit means including a single current determining element commonly coupled to first leads of said devices for passing separate currents through said devices to develop separate electrical conditions adapted to be sensed at second leads of said devices; and controllable current means having first and second inputs coupled to separate ones of the second leads of said devices and first and second outputs coupled to separate ones of said heater elements, said controlable current means responding to differences of said electrical conditions to inversely vary the conductives of said devices by passing a current alternately through said heater elements.

8. The combination set forth in claim 7 wherein said controllable current means includes switchable current means having first and second current paths coupled to said first and second outputs, respectively, and having first and second switching inputs coupled to said first and second inputs; and wherein said switchable current means responds to an unbalance of said electrical conditions in one sense to pass current through the first current path and to an unbalance of said electrical conditions in the opposite sense to pass current through the second current path.

9. The combination set forth in claim 8 wherein said switchable current means is a bistable circuit having said first and second switching inputs as inputs and said first and second outputs as outputs; and wherein said controllable current means further includes a detector means having first and second inputs coupled to separate ones of the second leads of said temperature sensitive devices and first and second outputs coupled to the first and second inputs, respectively, of the bistable circuit inputs, said detecting means sensing the unbalance of electrical conditions and applying the detected unbalance to said bistable circuit inputs.

10. The combination set forth in claim 9 wherein said detector means further includes a sample input for receiving sample signals which operate the detector to sense said unbalance conditions only during sampling intervals.

11. The invention as set forth in claim 10 wherein said bistable circuit includes third and fourth semiconductive devices, each having input, output and common electrodes, the output and common electrodes of said third and fourth devices being connected in separate ones of said first and second current paths, the input electrodes of said third and fourth devices corresponding to the first and second inputs of the bistable circuit, respectively, said third and fourth devices being cross-coupled from the input electrode of each to the output electrode of the other; and wherein said heater elements are connected in separate ones of the first and second current paths.

12. The combination set forth in claim 11 wherein said third and fourth devices are third and fourth transistors each having base, collector and emitter electrodes corresponding to the input, output and common electrodes, respectively; and wherein said controllable current means includes fifth and sixth transistors having their collector-to-emitter paths connected between the base electrodes of the third and fourth transistors and the first and second outputs, respectively, of the detector means, the base electrodes of said fifth and sixth transistors being coupled in common to a bias means.

13. The combination as set forth in claim 12 wherein said detector means includes seventh and eighth transistors and a sampled current determining element which is coupled to said sampling input, the base electrodes of said seventh and eighth transistors corresponding to the first and second inputs, respectively, of the detector means, the emitter electrodes of said seventh and eighth transistors being coupled in common to the sampled current determining element, and the collector electrodes of said seventh and eighth transistors corresponding to the first and second outputs of the detector means, respectively.

14. The combination as set forth in claim 13 wherein said sampled current determining element includes a ninth transistor having a collector electrode coupled to the emitters of said seventh and eighth transistors, an emitter electrode coupled to a point of fixed potential and a base electrode corresponding to said sampling input.

15. The combination set forth in claim 9 wherein said first circuit means further includes a pair of load impedances coupled to separate ones of the second leads of said devices.

16. The combination set forth in claim 15 wherein an input circuit and an output circuit are provided; wherein said semiconductor devices each have an input lead coupled to the input circuit; and wherein the second leads of the semiconductor devices are coupled to the output circuit.

17. The invention set forth in claim 14 wherein said first and second semiconductor devices are first and second transistors each having base, emitter and collector electrodes, the emitter and collector electrodes corresponding to the first and second leads of the semiconductor devices, respectively;

wherein said first circuit means includes a current source commonly coupled to the emitter electrodes of the first and second transistors;

wherein an input circuit and an output circuit are provided;

wherein the base electrodes of the first and second transistors are coupled to the input circuit; and wherein the collector electrodes of the first and second transistors are further coupled to the output circuit.

References Cited

UNITED STATES PATENTS

| | | | |
|---|---|---|---|
| 3,321,716 | 5/1967 | Lyon-Caen | 331—113 |
| 2,788,493 | 4/1957 | Zawels | 331—114 X |

ROY LAKE, *Primary Examiner.*

LAWRENCE J. DAHL, *Assistant Examiner.*

U.S. Cl. X.R.

330—30